United States Patent
Hsuan et al.

(10) Patent No.: US 7,170,167 B2
(45) Date of Patent: Jan. 30, 2007

(54) METHOD FOR MANUFACTURING WAFER LEVEL CHIP SCALE PACKAGE STRUCTURE

(75) Inventors: Min-Chih Hsuan, Hsinchu (TW); Paul Chen, Hsinchu (TW); Hermen Liu, Hsinchu (TW); Kun-Chih Wang, Hsinchu (TW); Kai-Kuang Ho, Hsinchu (TW)

(73) Assignee: United Microelectronics Corp., Hsinchu (TW)

( * ) Notice: Subject to any disclaimer, the term of this patent is extended or adjusted under 35 U.S.C. 154(b) by 101 days.

(21) Appl. No.: 10/711,536

(22) Filed: Sep. 24, 2004

(65) Prior Publication Data

US 2006/0065976 A1    Mar. 30, 2006

(51) Int. Cl.
*H01L 23/48* (2006.01)

(52) U.S. Cl. .................................................. 257/734
(58) Field of Classification Search ................ 438/119, 438/106, 30; 257/773, 734
See application file for complete search history.

(56) References Cited

U.S. PATENT DOCUMENTS 5,783,465 A * 7/1998 Canning et al. ............. 438/119
6,908,784 B1 * 6/2005 Farnworth et al. .......... 438/106

* cited by examiner

*Primary Examiner*—Carl Whitehead, Jr.
*Assistant Examiner*—Monica D. Harrison
(74) *Attorney, Agent, or Firm*—Jianq Chyun IP Office

(57) ABSTRACT

The present invention relates to a method for manufacturing a wafer level chip scale package structure including the following steps. After providing a glass substrate and a wafer comprising a plurality of chips, the active surface of the wafer is connected to the top surface of the glass substrate. The wafer is connected with the glass substrate through either bumps or pads thereon. After drilling the glass substrate to form a plurality of through holes, a plating process is performed to form a plurality of via plugs in the through holes. Afterwards, a singulation step is performed and a plurality of chip scale package structures is obtained.

9 Claims, 7 Drawing Sheets

METHOD FOR MANUFACTURING WAFER LEVEL CHIP SCALE PACKAGE STRUCTURE

BACKGROUND OF THE INVENTION

1. Field of Invention

The present invention relates to a chip package structure and a method for manufacturing the chip package structure. More particularly, the present invention relates to a method for manufacturing a wafer level chip scale package structure with a compact size.

2. Description of Related Art

Chip scale package (CSP) is a package that has an area of no more 20% larger than that of the die. With better protection by molding encapsulation and better board level reliability, CSP prevails over the direct chip attach (DCA) and chip on board (COB) technologies.

Taking chip scale packaging process as an example, the backs of the chips are attached to the substrate and the chips are electrically connected to the substrate through wire bonding. The chips and the substrate are simultaneously encapsulated by the encapsulating material in transfer molding process. After performing singulation by dicing, a plurality of chip package structures is obtained. FIG. 1 is a cross-sectional view of the prior art CSP structure after dicing. Referring to FIG. 1, one chip package structure 102 includes the substrate 110, the chip (die) 130 and the molding compound 170. In general, the back of chip 130 is glued onto the substrate 110 by silver epoxy, and the chip (from the top surface) is electrically connected to the substrate 110 through wires 180 by wire bonding. The chip 130 and wires 180 are covered by the molding compound 170 formed by encapsulation. The substrate 110 further includes solder balls 190 on the bottom for external electrical connection. Due to the application of wires and the molding compound, the package structure is somehow larger and thicker than the chip itself. In general, the size (area) of CSP package is about 20% larger than the die and the height (thickness) of CSP package is around 1.2 mm.

However, issues around the reliability of the packaging still remain. For the package structure comprised of silicon chip, bismaleimide triazine (BT) substrate, the molding compound and silver epoxy, it would encounter various stress-related problems due to different coefficient of thermal expansion (CTE). For the prior art CSP structure, the CTE mismatch between the package substrate and the silicon chip is large (about 14 ppm) thus lowering the reliability and quality of the package structure. Moreover, the fabrication processes of the prior art CSP structure are complex and the widely used BT substrate is quite costly.

SUMMARY OF THE INVENTION

The present invention provides a chip package structure with a compact size and lower costs and a method for manufacturing the chip package structure.

The present invention provides a method for manufacturing a wafer level chip scale package structure, which increases reliability of the attachment between the chip and the substrate.

As embodied and broadly described herein, the present invention provides a method for manufacturing a wafer level chip scale package structure including the following steps. After providing a glass substrate and a wafer comprising a plurality of chips, the active surface of the wafer is connected to the top surface of the glass substrate. The wafer is connected with the glass substrate through either bumps or pads thereon. After drilling the glass substrate to form a plurality of through holes, a plating process is performed to form a plurality of via plugs in the through holes. Afterwards, a singulation step is performed and a plurality of chip scale package structures is obtained.

According to one embodiment, the bumps on the active surface of the wafer are bonded to the top surface of the glass substrate by eutectic bonding or anisotropic conductive film (ACF). According to another embodiment, pads on the active surface of the wafer are attached to the top surface of the glass substrate by thermal cured adhesives.

According to the present invention, the size ratio of die (chip) and the CSP package structure is nearly 1.0 and is more compact than the prior art package structure. Due to the lower cost of the glass substrate and less area required for the glass substrate, the cost for the package structure of this invention is estimated to be much lower than that of the conventional package structure. Moreover, the manufacturing processes provided in the present invention are greatly simplified without wire bonding or encapsulation process, which reduce the package costs and increase the package yield.

Besides, by using the glass substrate, the thermal stress due to CTE mismatch between the chip and the substrate is reduced and the reliability of the package structure is improved.

It is to be understood that both the foregoing general description and the following detailed description are exemplary, and are intended to provide further explanation of the invention as claimed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention. In the drawings.

DESCRIPTION OF THE PREFERRED EMBODIMENTS

In semiconductor packaging, faster and smaller electronic packaging approaches with high I/O counts and complex semiconductor devices are intensely required. Flip chip (FC) and wafer level chip scale packaging (WL-CSP) meet the requirements of high I/O-devices and even for low pin-count applications. In addition, wafer level packaging can reduce the cost of packaging each individual chip.

FIGS. 2–7 are cross-sectional views illustrating the manufacturing steps of a CSP structure according to one preferred embodiment of the present invention.

Figure 1:
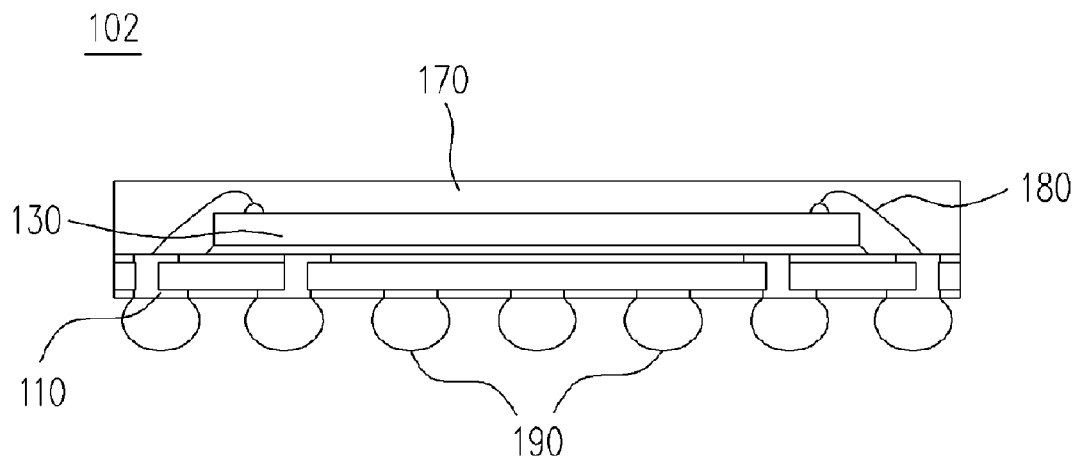
FIG. 1 is a cross-sectional view of the prior art CSP package structure after dicing.
Figure 2:
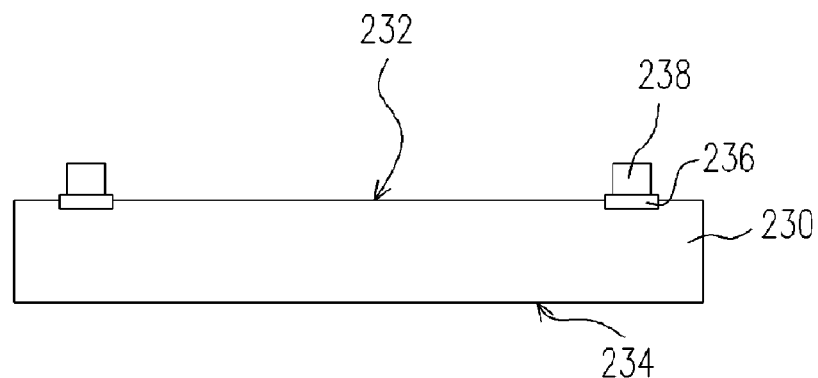
FIGS. 2–7 are cross-sectional views illustrating the manufacturing steps of the CSP package structure according to one preferred embodiment of the present invention.

Referring to FIG. 2, a semiconductor wafer 230 is provided with an active surface 232 and an opposite back surface 234. A plurality of bonding pads 236 are disposed on the active surface 232 of the wafer 230 and a plurality of bumps 238 are disposed on the bonding pads 236. According to the preferred embodiment, bumps 238, such as, Sn/Pb solder bumps, gold bumps or other high melting point bumps, are formed over the bonding pads 236. In addition, an under metal metallurgy (UBM) layer (not shown) is formed for increasing attachment between the bonding pad 236 and the bump 238, which is made of metals selected from the following group consisting of nickel, gold, titanium, copper and palladium.

The bumps 238 are formed by, for example, implanting globular tin/lead globes onto the surface of the bonding pad 236. Alternatively, the bumps 238 are formed by, for example, stencil printing the low melting temperature tin/lead paste to the surface of the bonding pad 236 and performing a reflow step to obtain the globular bumps. Alternatively, the bump 238 can be formed by electroplating method.

Figure 3:
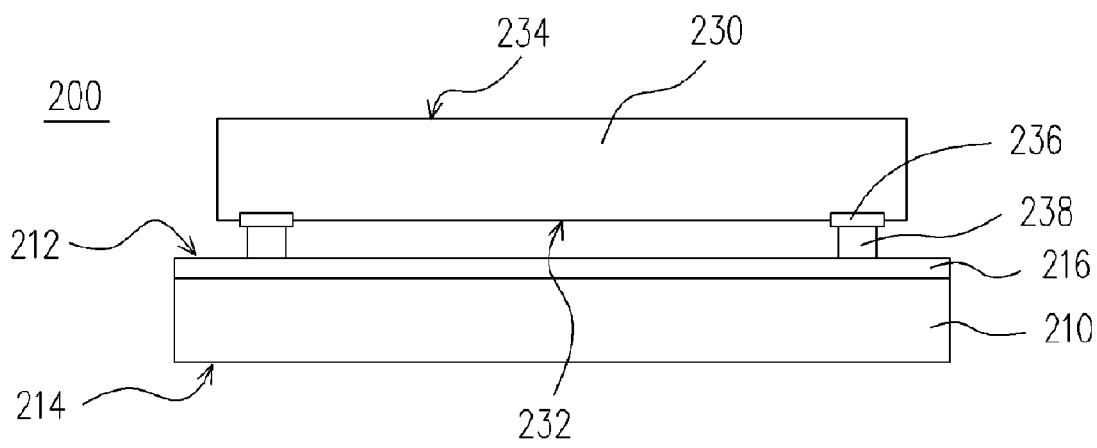

Referring to FIG. 3, a substrate 210 is provided with a top surface 212 and a back surface 214. The substrate 210 is, for example, an indium tin oxide (ITO) conductive glass plate provided with a metallic interconnect pattern 216 on the top surface 212. The thickness of substrate 210, for example, is about 100–400 microns, preferably 200–300 microns. The wafer 230 is flipped, so that the active surface 232 faces the top surface 212 of the substrate 210. The flipped wafer 230 is then arranged onto the substrate 210, so as to bond the bumps 238 of the wafer 230 onto the top surface 212 of the substrate 210. The bumps 238 can be bonded to the interconnection pattern 216 of the substrate 210, by either eutectic bonding or using anisotropic conductive film (ACF). The eutectic bonding metallurgically attaches the bumps of the wafer to the substrate by using eutectic preforms in various compositions. Alternatively, the ACF consisting of non-filled adhesive layer and a thermal-setting adhesive layer filled with conductive particles can be placed between the bumps and the substrate for bonding. Still, the bonding should create uniform connection between the bumps 238 of the wafer 230 and the substrate 210. The wafer 230 is electrically connected to the substrate 210 through the bumps 238 and the interconnection pattern 216.

By using a glass substrate, the CTE mismatch between the wafer (or die) and the glass substrate is relatively small, so that thermal stress caused by CTE mismatch is greatly reduced. In accordance with the embodiment, no underfill process is required.

Figure 4:
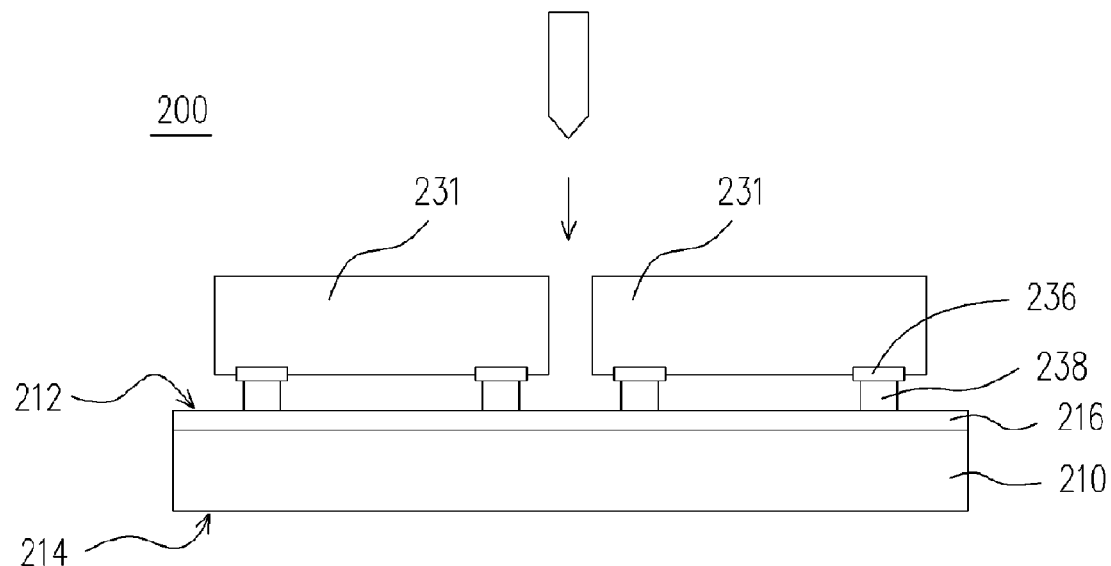

Referring to FIG. 4, a wafer dicing process is performed to cut the wafer 230 into a plurality of dies 231 by using wafer saw technology. Basically, the wafer is cut along the scribe-lines.

Figure 5:
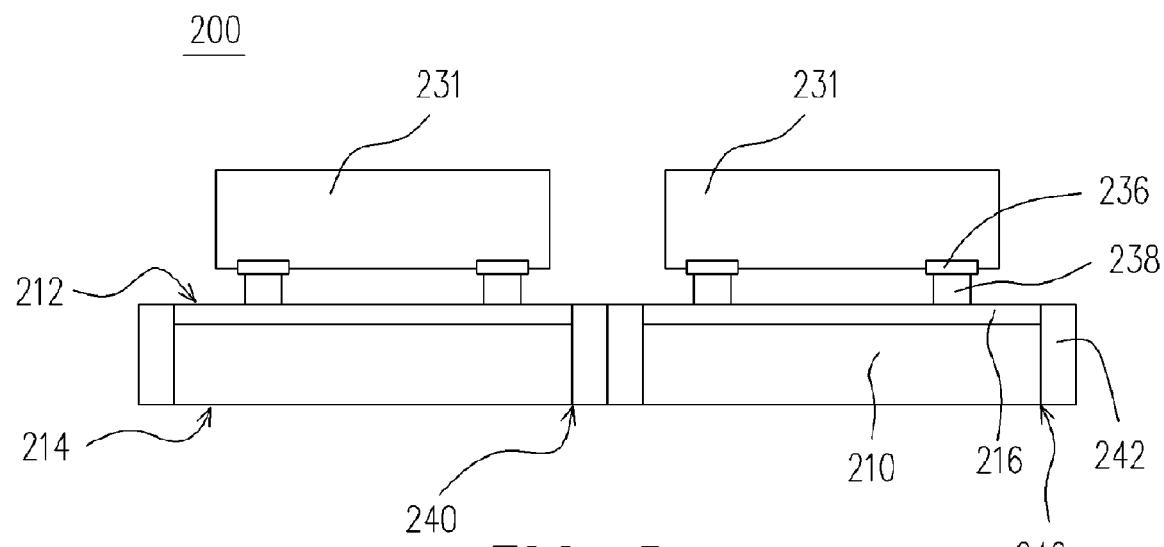

Referring to FIG. 5, a through-hole (TH) drilling process is performed by, for example, laser drilling, to form through-holes 240 through the substrate plate 210. The size of the through-holes can be about 20–50 microns. Afterwards, a plating process, for example, electroplating or electroless plating process, is performed to fill up the through-holes 240, so that metal vias 242, for example, copper vias, are formed within the through-holes.

Alternatively, the process steps described in FIGS. 4 and 5 can be performed in a reverse order, i.e. firstly performing the TH drilling process and the plating process, and subsequently performing the wafer dicing process. In this case, the through-holes (or vias) are aligned with the scribe-lines of the wafer 210.

Optionally, a wafer testing process can be performed to test electrical properties of the CSP package structure or the die by probing through the vias 242.

Figure 6:
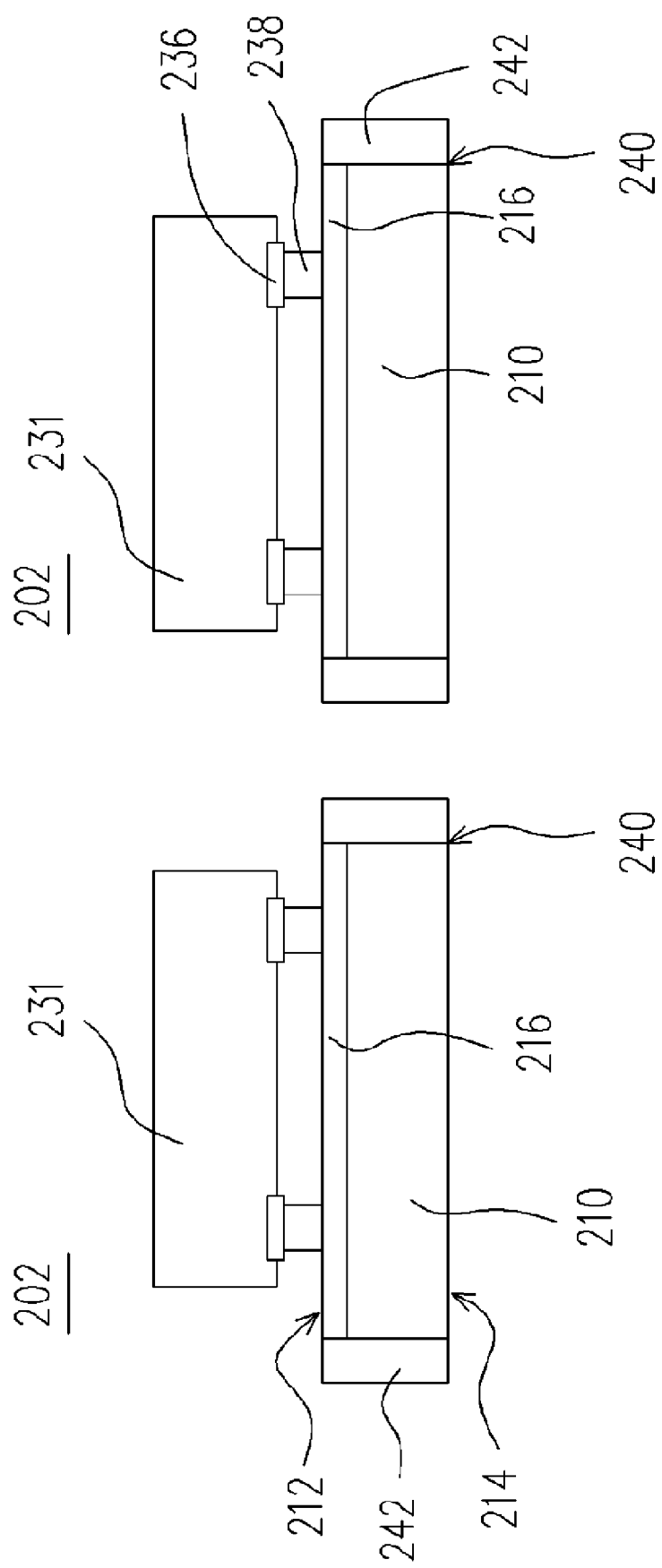

Referring to FIG. 6, a singulation (dicing) process is performed to dice the glass substrate 210 (and the interconnection pattern 216 on the substrate) through the metal vias 242, so that the WL-CSP package structure 200 are divided into a plurality of individual CSP package structures 202. Each CSP package structure 202 includes at least a portion of the substrate 210 (with a portion of the interconnection pattern), the die 231 connected to the substrate through a plurality of bumps 238, and a plurality of vias 242, arranged as described above and shown in FIG. 6. The size ratio of die 231 and the obtained CSP package structure 202 is nearly 1.0.

The obtained CSP package structure 202, as shown in FIG. 6, can be directly applied as a peripheral type package structure.

Figure 7:
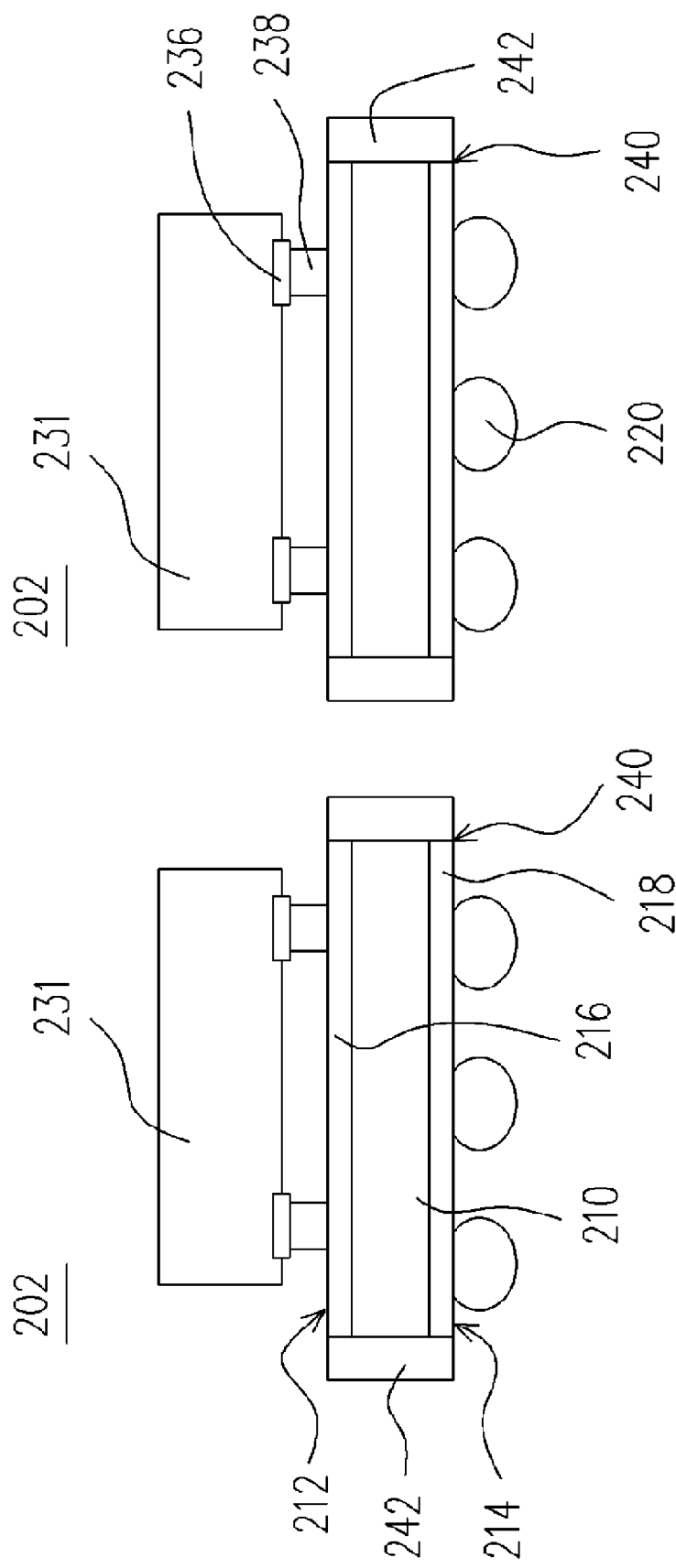

However, if the CSP package structure 202 will be applied as an array type package structure, the glass substrate 210 needs to be pre-treated to form a redistribution layer 218 on the back surface 214 for the following ball implanting process. The redistribution layer 218 can be formed by, for example, sputtering an ITO film or electroplating a copper film on the back surface 214 of the glass substrate 210. Moreover, additional process needs to be performed to the array type CSP package structure. Referring to FIG. 7, a plurality of solder balls 220 are formed on the redistribution layer 218 of the substrate 210 by solder-ball attachment.

In the above embodiment, the dicing process is performed prior to the formation of solder balls. Alternatively, it is possible to form solder balls before the singulation process.

FIGS. 8–12 are cross-sectional views illustrating the manufacturing steps of a CSP structure according to another preferred embodiment of the present invention.

Figure 8:
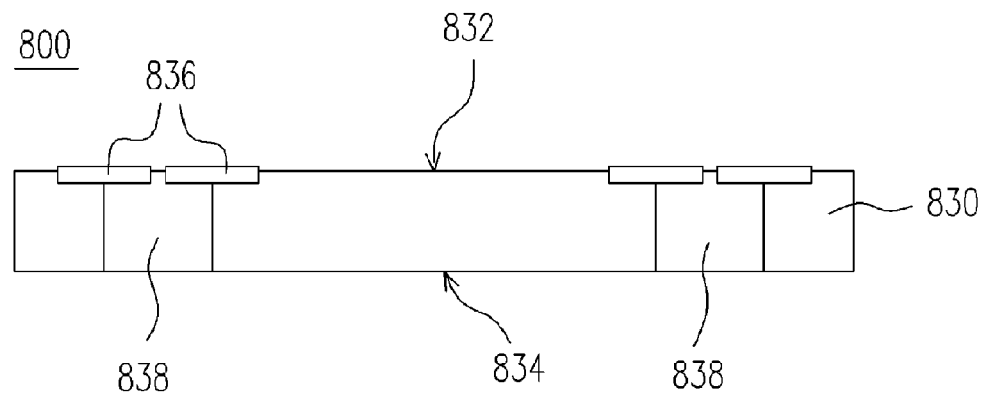
FIGS. 8–12 are cross-sectional views illustrating the manufacturing steps of the CSP package structure according to another preferred embodiment of the present invention.

Referring to FIG. 8, a semiconductor wafer 830 is provided with an active surface 832 and an opposite back surface 834. A plurality of pads 836, for example, contact pads, are disposed on the active surface 832 of the wafer 830. The pads 836 are designed to partially extend to cover scribe-lines 838 of the wafer 830. The scribe-line 838 usually has a width of about 80–150 microns.

Figure 9:
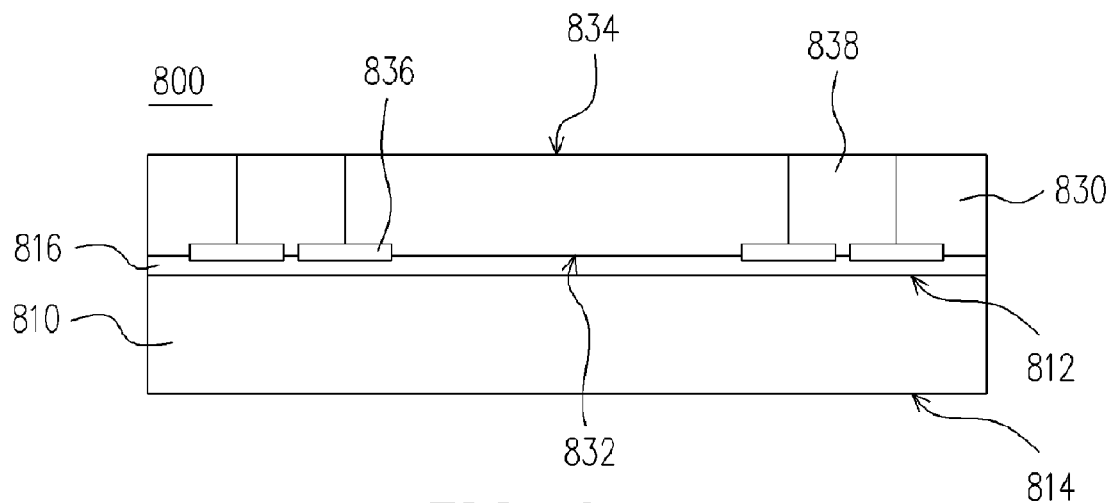

Referring to FIG. 9, a substrate 810 is provided with a top surface 812 and a back surface 814. The thickness of substrate 810, for example, is about 100–400 microns, preferably 200–300 microns. The wafer 830 is flipped, so that the active surface 832 faces the top surface 812 of the substrate 810. The flipped wafer 830 is then arranged onto the substrate 810, so as to attach the pads 836 of the wafer 830 onto the top surface 812 of the substrate 810. The pads 836 can be attached to the substrate 810, by thermal cured adhesives 816. Optionally, the back surface 834 of the wafer 830 can be ground by backgrinding technology to a predetermined thickness, for example, as thin as about 25–50 microns.

Figure 9A:
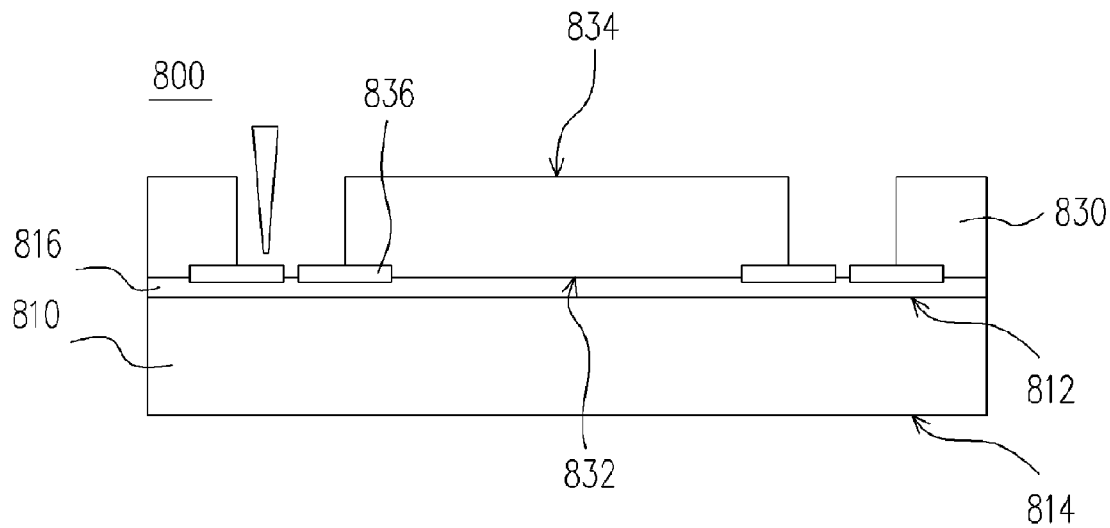

Alternatively, as shown in FIG. 9A, to the back surface 834 of the wafer 830, an etching process is performed to remove the scribe-lines 838, until surfaces of the pads 836 are exposed. In this case, the wafer 830 has in fact been cut into individual dies.

By using a glass substrate, the CTE mismatch between the wafer (or die) and the glass substrate is relatively small, so that thermal stress caused by CTE mismatch is greatly reduced. In accordance with the embodiment, no underfill process is required.

Figure 10:
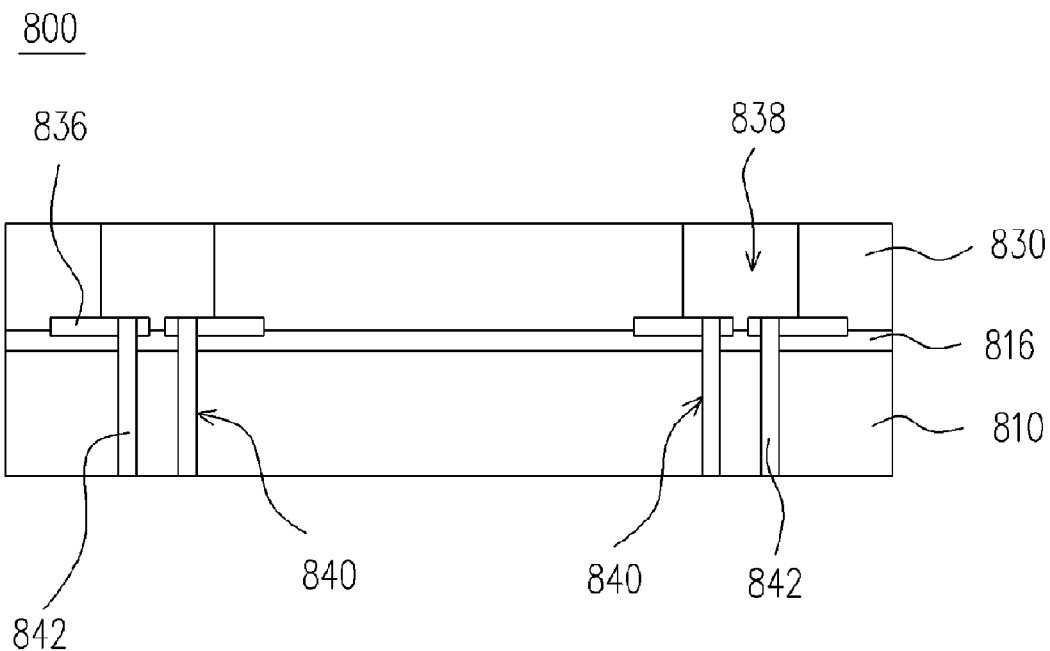
Figure 10A:
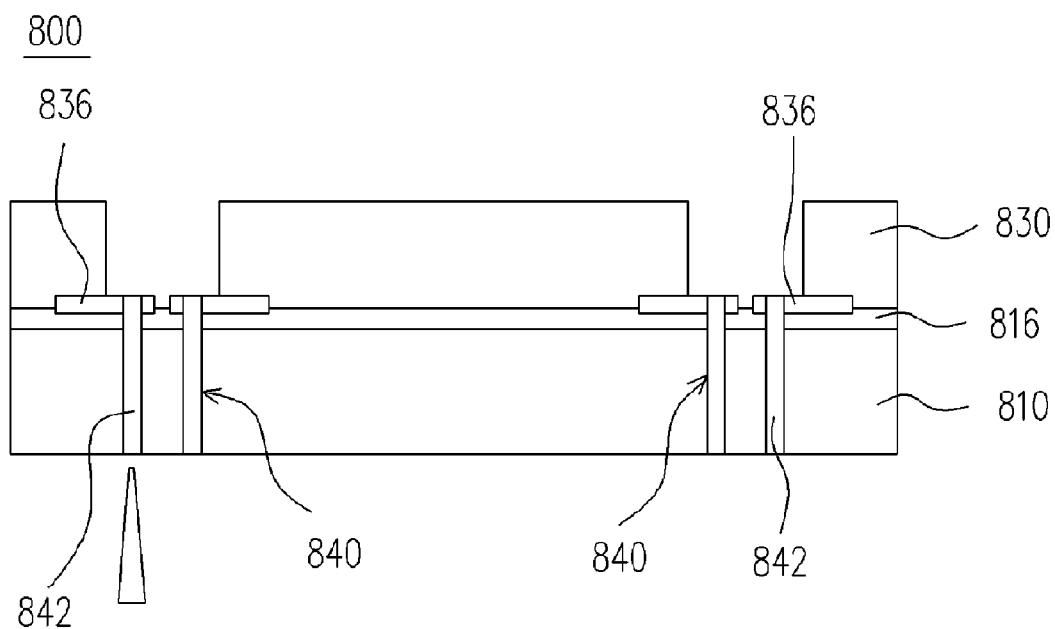

Following the process steps described in FIGS. 9 and 9A and referring to FIGS. 10 and 10A respectively, a through-hole (TH) drilling process is performed by, for example, laser drilling, to form through-holes 840 through the substrate plate 810. The size of the through-holes can be about 20–50 microns. Afterwards, a plating process, for example, electroplating or electroless plating process, is performed to fill up the through-holes 840, so that metal vias 842, for example, copper vias, are formed within the through-holes 840. In general, the locations of the vias 842 (or through-holes 840) are aligned with the pads 836. Preferably, each of the vias 842 is aligned to and connected to one pad 836.

Optionally, a wafer testing process can be performed to test electrical properties of the CSP package structure or the die by probing through the vias 842 or even through the exposed pads 836 (FIG. 9A).

Figure 11:
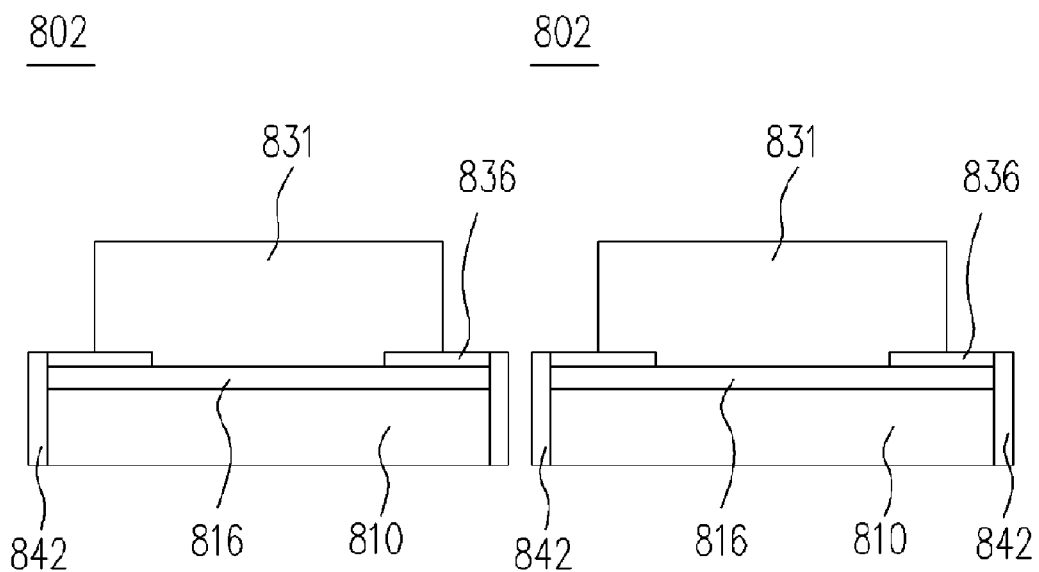

Referring to FIG. 11, a singulation (dicing) process is performed to cut the wafer 830 into a plurality of dies 831 and dice the glass substrate 810 (and the thermal cured adhesive 816 on the substrate) through the metal vias 842, so that the WL-CSP package structure 800 are divided into a plurality of individual CSP package structures 802. For the structure shown in FIG. 9A, the wafer 830 has already been cut into individual dies by removing the scribe-lines, the singulation process dices up the substrate 810 to obtain individual CSP package structures 802. Each CSP package structure 802 includes at least a portion of the substrate 810, the die 831 connected to the substrate through a plurality of pads 836, and a plurality of vias 842, arranged as described above and shown in FIG. 11. The size ratio of die 831 and the obtained CSP package structure 802 is nearly 1.0.

The obtained CSP package structure 802, as shown in FIG. 11, can be directly applied as a peripheral type package structure.

Figure 12:
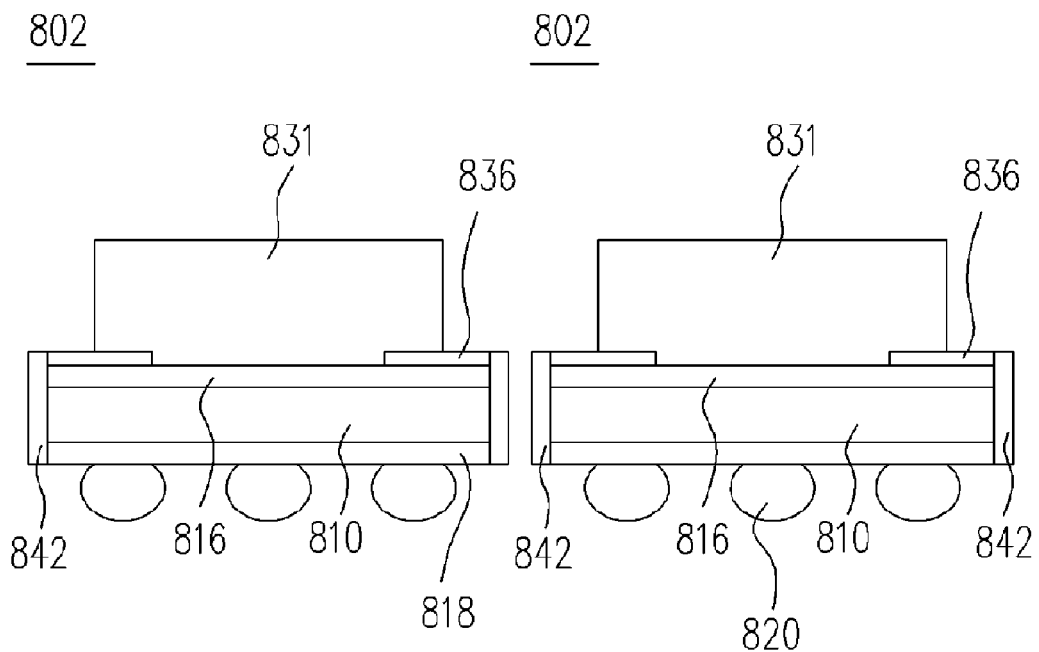

However, if the CSP package structure 802 will be applied as an array type package structure, the glass substrate 810 needs to be pre-treated to form a redistribution layer 818 on the back surface 814 for the following ball implanting process. The redistribution layer 818 can be formed by, for example, sputtering an ITO film or electroplating a copper film on the back surface 814 of the glass substrate 810. Moreover, additional process needs to be performed to the array type CSP package structure. Referring to FIG. 12, a plurality of solder balls 820 are formed on the redistribution layer 818 of the substrate 810 by solder-ball implantation.

In the above embodiment, the dicing process is performed prior to the formation of solder balls. Alternatively, it is possible to form solder balls before the singulation process.

According to the present invention, the size ratio of die (chip) and the singulated CSP package structure is nearly 1.0. Compared with the prior CSP package, the package structure of this invention has a size about 20% less. Moreover, without the wires and the molding compound, the package structure of this invention has a height (thickness) of about 300–800 microns. Therefore, the package structure of this invention is more compact than the prior art structure.

On the other hand, the manufacturing processes provided in the present invention are greatly simplified without wire bonding or encapsulation process, which reduce the package costs and increase the package yield. Because the cost of the glass substrate is lower than the conventional BT substrate, the cost of the resultant package is also reduced. The cost for the package structure of this invention is estimated to be about 40–50% lower than that of the conventional package structure.

Moreover, by using the glass substrate, the thermal stress due to CTE mismatch between the chip and the substrate is reduced and the reliability of the package structure is improved.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A wafer level chip scale package structure process, comprising:
    providing a glass substrate having a first surface and a second surface, wherein an interconnect pattern is disposed on the first surface of the glass substrate;
    providing a wafer comprising a plurality of chips and having an active surface and a back surface, wherein a plurality of bumps is disposed on the active surface of the wafer;
    flipping the wafer, so that the active surface of the wafer faces the first surface of the glass substrate;
    disposing the wafer on the glass substrate and connecting the active surface of the wafer to the first surface of the glass substrate through attachment of the bumps and the interconnect pattern;
    performing a first dicing step whereby the wafer is cut;
    drilling the glass substrate to form a plurality of through holes;
    subsequent to the first dicing step, forming a plurality of via plugs in the through plated holes in the glass substrate; and
    performing a second dicing step to dice the glass substrate and the interconnect pattern at the through hole to form a plurality of chip scale package structures with plated/ or metal or metallic layers on the side edges of the substrate.

2. The process of claim 1, wherein the glass substrate is an indium tin oxide glass plate.

3. The process of claim 1, wherein the bumps are attached to the interconnection pattern of the substrate by eutectic bonding.

4. The process of claim 1, wherein the bumps are attached to the interconnection pattern of the substrate by using anisotropic conductive film (ACF).

5. The process of claim 1, wherein a redistribution layer is formed on the second surface of the glass substrate and a plurality of solder balls are formed on the second surface of the glass substrate, after dicing the glass substrate and the interconnect pattern.

6. The process of claim 1, wherein a wafer level testing process is performed through the via plugs or the interconnect pattern before dicing the glass substrate and the interconnect pattern.

7. The process of claim 1, wherein the via plugs are formed by plating.

8. The process of claim 1, wherein a material of the via plug is copper.

9. The process of claim 1, further comprising grinding the wafer from the back surface of the wafer before dicing the wafer.

* * * * *